United States Patent [19]

Baba et al.

[11] 4,278,989
[45] Jul. 14, 1981

[54] SEMICONDUCTOR DEVICE HAVING CROSS WIRES

[75] Inventors: Fumio Baba; Kiyoshi Miyasaka; Takashi Yabu, all of Yokohama; Jun-ichi Mogi, Kawasaki, all of Japan

[73] Assignee: Fujitsu Limited, Tokyo, Japan

[21] Appl. No.: 3,286

[22] Filed: Jan. 15, 1979

[30] Foreign Application Priority Data

Jan. 20, 1978 [JP] Japan ............... 53-5933[U]

[51] Int. Cl.³ .......................................... H01L 27/00
[52] U.S. Cl. ...................... 357/59; 357/41; 357/71
[58] Field of Search ............ 357/51, 59, 71, 68; 307/213, 303

[56] References Cited

U.S. PATENT DOCUMENTS

| 3,821,781 | 6/1974 | Chang et al. | 357/59 |
|---|---|---|---|
| 3,964,092 | 6/1976 | Wadham | 357/71 |
| 4,012,757 | 3/1977 | Koo | 357/24 |
| 4,013,489 | 3/1977 | Oldham | 357/51 |
| 4,162,506 | 7/1979 | Takei | 357/71 |
| 4,163,246 | 7/1979 | Aomura et al. | 357/68 |
| 4,180,826 | 12/1979 | Shappir | 357/59 |
| 4,183,040 | 1/1980 | Rideout | 357/51 |

Primary Examiner—William D. Larkins
Attorney, Agent, or Firm—Staas & Halsey

[57] ABSTRACT

A lower member of a cross wire structure formed in a semiconductor device, such as an MIS type semiconductor memory device, is provided with a structure of at least two layers of an impurity-containing polycrystalline semiconductor material according to the method disclosed. These layers are connected in parallel and their resistance is thus decreased. Furthermore, since these layers may be formed within insulating films over a semiconductor substrate, the degree of integration of the semiconductor device may be enhanced. The method for producing the cross electrodes allows simultaneous fabrication of other semiconductor devices, for instance MIS devices with components commonly fabricated with the cross electrode structures.

13 Claims, 3 Drawing Figures

SEMICONDUCTOR DEVICE HAVING CROSS WIRES

BACKGROUND OF THE INVENTION

1. Field of the Invention

The present invention relates to a semiconductor device and, more particularlly, to a semiconductor device having a cross wire structure, as well as to a method for its manufacture.

2. Description of the Prior Art

In the art of semiconductor devices, particularly in the art of semiconductor integrated circuit devices, there has been a need to enhance the degree of circuit integration. However, with respect to the MIS type semiconductor memory device comprising a basic metal-insulator-semiconductor element, there is also a great need to enhance the memory capacity in addition to the degree of circuit integration. It is therefore necessary to increase the density of the MIS type semiconductor elements formed on the semiconductor substrate and, in turn, the density of the wiring formed over the substrate. As a result, more intersecting wires are formed on the substrate.

A so-called cross-over structure or cross-under structure was previously employed for producing the cross wire structure. According to the cross-over structure, an intermediate insulating layer is positioned between the two cross wires, one of which is elongated on the insulating layer as the upper wire layer.

According to the cross under structure, one of the cross wires is discontinued between two points and connected to an impurity diffusion region or to a buried diffusion region in the semiconductor substrate for connection between these two points and an elongated conducting line is thus produced. However, since the steps for producing the intermediate layer in the crossover structure for insulating the upper and lower wire layers, as well as the steps for producing the upper wire layer, are indispensable to the overall process, the number of production steps is thus increased. As to the cross-under structure, it is indispensable to form on or in the substrate a diffusion layer for the lower wire, which makes it difficult to increase the degree of integration of the MIS semiconductor devices in the same substrate.

SUMMARY OF THE INVENTION

It is, therefore, an object of the present invention to provide a semiconductor device having a cross wire structure, which can be advantageously produced without increasing the number of the production steps and which enhances the degree of integration of the semiconductor devices, as well as a method for producing the same.

It is another object of the present invention to provide the connecting portions comprising the cross wire structure with a sufficiently low resistance.

In accordance with the objects of the present invention, there is provided a semiconductor device comprising:

a semiconductor substrate;

a first insulating film covering a surface of the semiconductor substrate;

a lower layer and an upper layer of a conductive semiconductor, which layers extend along one direction and overlap each other over the first insulating film;

a second insulating film covering the upper layer of conductive semiconductor;

a first metallic wire layer formed on a portion of the second insulating film, the first metallic wire layer being connected to both ends of each of the lower and upper layers of the conductive semiconductor; thereby connecting these lower and upper layers in parallel; and a second metallic wire layer formed on a portion of the second insulating film and crossing the first metallic wire layer.

A third insulating film may separate the upper and lower conductive semiconductor layers.

According to an embodiment of the present invention, part of the wire constituting the cross wire structure and connecting the predetermined elements of the semiconductor device with one another is made of impurity-containing polycrystalline silicon. The resistance of the polycrystalline silicon is inherently high as compared with that of a metal wire. Accordingly, the resistance of the polycrystalline silicon cannot be lowered enough even by including or doping a large amount (a high concentration) of impurity thereinto. A single layer of the impurity-containing polycrystalline silicon is therefore inadequate for one of the cross wires, because the operating speed of the resultant semiconductor device is too low. Accordingly, at least two layers of the polycrystalline silicon must be connected in parallel so as to reduce the resistance of the wire made of such polycrystalline silicon.

According to a further embodiment of the present invention, each of the impurity-containing polycrystalline semiconductor layers is formed between the upper and lower insulating films.

According to another embodiment, wherein the size of the semiconductor device is advantageously reduced, an upper impurity-containing polycrystalline semiconductor layer is positioned above a lower impurity-containing polycrystalline semiconductor layer, in such a manner that the lateral positions and areas of these layers essentially coincide.

According to a preferred embodiment of the present invention, the cross wire structure of the invention is formed as a part or as parts of the MIS type semiconductor device and, particularly, of the MIS type semiconductor memory device, thereby reducing the size of the semiconductor device.

When the MIS type semiconductor memory device having a dual-gate structure, or a double polycrystalline silicon gate structure as disclosed in U.S. Pat. No. 3,996,658 issued to Takei et al, is provided with a cross wire structure as that of the present invention, the size of the semiconductor device is considerably reduced.

In accordance with another preferred embodiment of the present invention, there is provided a semiconductor integrated circuit device comprising a double semiconductor gate metal-insulator-semiconductor element on a first surface area of a semiconductor substrate and a cross wire structure on a second surface area of the semiconductor substrate, which embodiment further comprises:

a first insulating film covering the second surface area of the semiconductor substrate and surrounding the first surface area of the semiconductor substrate;

a first insulated semiconductor gate electrode formed on a first part of the first surface area;

a second insulated semiconductor gate electrode on a second part of the first surface area, the first and second semiconductor electrodes insulating portions constituting the double semiconductor gate;

a lower layer and an upper layer of a conductive semiconductor extending along one direction and overlapping each other above the first insulating film, the lower layer being comprised of the same semiconductor material as that of the first semiconductor electrode, the upper layer being comprised of the same semiconductor material as that of the second semiconductor electrode;

a second insulating film selectively covering the first and second surface areas and the upper and lower conductive semiconductor layers;

a first metallic wire layer formed on a portion of the second insulating film and connected to both ends of each of the lower and upper conductive semiconductor layers, thereby connecting the lower and upper conductive semiconductor layers in parallel; and a second metallic wire layer formed on a portion of the second insulating film over the second surface area, the second metallic wire layer crossing over the first and second conductive semiconductor layer and comprising the same metal as that of the first metallic wire layer.

A third insulating film may separate the upper and lower conductive semiconductor layers, and this same film may extend to insulate overlapping portions of two gates of the double gate element.

According to the present invention, no additional steps are required for producing the cross wire structure which has two or more layers for the lower "wire" member, because these layers can be formed simultaneously with the formation of the double semiconductor gate of the MIS type semiconductor element. The MIS type semiconductor memory device which has partially overlapping double-gate electrodes and which is disclosed in the above-referenced U.S. Pat. No. 3,996,658 has recently been employed for a dynamic memory produced by the Assignee of the present application. The above-mentioned dynamic memory having the dual- or double-gate electrodes and a further cross wire structure can be easily produced according to the present invention. When insulating films made of phosphosilicate glass for introducing an impurity are used for a middle and the upper insulating films of the cross wire structure, the process for producing the dynamic memory is further simplified.

BRIEF DESCRIPTION OF THE DRAWINGS

The present invention is explained in detail with reference to the accompanying drawings, wherein.

DETAILED DESCRIPTION PREFERRED EMBODIMENTS

Figure 2:
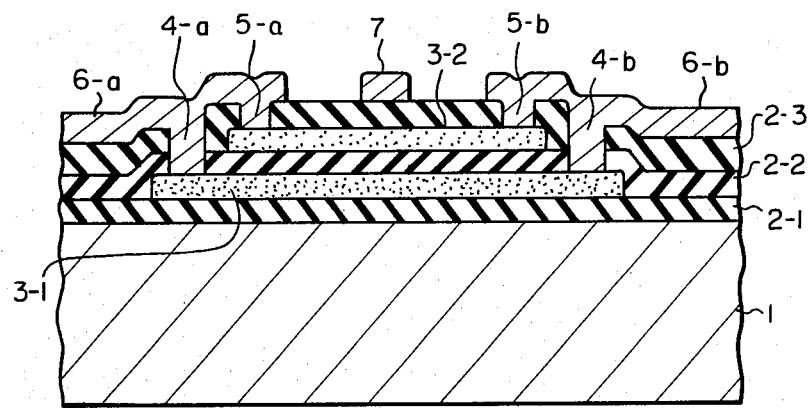
FIG. 2 is a cross-sectional view taken along line II—II of FIG. 1.

Referring to FIG. 2, a first insulating film 2-1 comprising of, for example, silicon dioxide ($SiO_2$) is formed on a portion of the surface of a silicon semiconductor substrate 1. By following a known thermal oxidation process, the silicon dioxide film 2-1 is formed to a thickness ranging from 0.5 to 1 micron. The first polycrystalline silicon layer is denoted in FIG. 2 as "3-1" and is formed on a portion of the first insulating film 2-1. The second insulating film 2-2 comprising of, for example, a phosphosilicate glass (PSG), is formed on the entire top surface of the substrate, and then the phosphorus of the PSG film 2-2 is diffused into the first polycrystalline silicon layer 3-1. A second polycrystalline silicon layer 3-2 is selectively formed on the second insulating film 2-2, e.g., the PSG film, in such a manner that the second layer 3-2 overlaps the first impurity-containing polycrystalline silicon layer 3-1. A third insulating film 2-3 comprising of, for example, a PSG film, is formed on the entire top surface of the substrate, and then the phosphorus is diffused into the second polycrystalline silicon layer 3-2. The impurity concentration in the first and second polycrystalline silicon layers 3-1 and 3-2 is usually above $10^{18}$ cm$^{-3}$. As can be seen in FIG. 2, the first and second impurity-containing polycrystalline silicon layers 3-1 and 3-2 separate the upper and lower insulating layers. Therefore, it will be apparent that the first and second impurity-containing polycrystalline silicon layers 3-1 and 3-2 are formed respectively between the insulating films 2-1, 2-2 and 2-3, which cover the silicon substrate 1.

Figure 1:
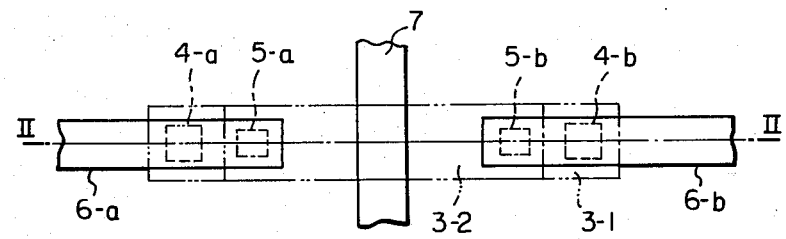
FIG. 1 is a partial plan view of cross wires of a semiconductor device according to an embodiment of the present invention.

Windows 4-a and 4-b (FIG. 1) are formed through the third and second insulating films 2-3 and 2-2, so as to expose both ends of the first impurity-containing polycrystalline silicon layer 3-1. Windows 4-a and 4-b are used for connecting the first impurity-containing polycrystalline silicon layer 3-1 with the metallic lead member or the first, metallic wire layers 6-a. Windows 5-a and 5-b are formed through the third insulating film 2-3 so as to expose both ends of the second impurity-containing polycrystalline silicon layer 3-2. The windows 5-a and 5-b are used for connecting the second polycrystalline silicon layer 2-3 with the metallic lead members 6-a and 6-b. The windows 4-a 4-b, 5-a and 5-b are simultaneously formed by a photolithographic process. The metal leads of the first metallic wire layer, for example, aluminum wires 6-a and 6-b, are connected to both ends of each of the first and second impurity-containing polycrystalline silicon layers 3-1 and 3-2, respectively. Therefore, the metal wires 6-a and 6-b and the polycrystalline silicon layers 3-1 and 3-2 connected in parallel by these metal wires constitute a lower conducting layer, i.e., the lower "wire" of a cross wire structure for a semiconductor device. Since at least two layers of the polycrystalline semiconductor material, for example, the two layers 3-1 and 3-2 in the embodiment illustrated in FIG. 2, are connected in parallel, the speed of the semiconductor device becomes advantageously high due to the low resistance of the parallel connected layers 3-1 and 3-2. It is clear that the second insulating film 2-2 is not essential to the crossover structure, but merely provides one doping means for the first impurity-containing polycrystalline silicon layer 3-1, as disclosed below in connection with methods for producing such crossover structures of the present invention.

The second metallic wire 7 comprises of, for example, aluminum, and extends in the direction crossing the first metallic wire comprising 6-a, 6-b, 3-1 and 3-2 on the third insulating layer 2-3 covering the second impurity-containing polycrystalline silicon layer 3-2.

The first and second metallic wires 6-a and 6b and 7 may be simultaneously formed by selectively removing one metal layer deposited over the insulating film 2-3.

The thickness of the first and second impurity-containing polycrystalline silicon layers is several thousands of angstroms. The width and length of such layers are adjusted in accordance with the form and density of a wiring pattern.

Figure 3:
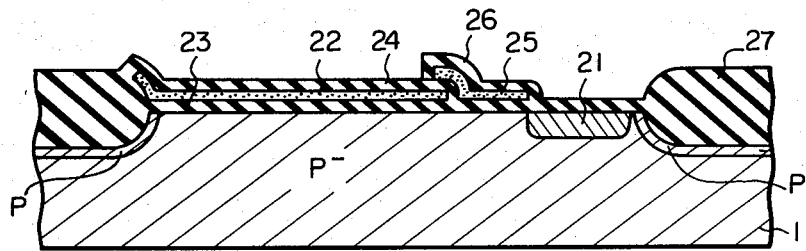
FIG. 3 is a cross-sectional view of an MIS type semiconductor memory device disclosed in the above-referenced U.S. Pat. No. 3,996,658.

An embodiment of the present invention for producing an MIS type semiconductor device will now be explained. Referring to FIG. 3, which illustrates an element of the double polycrystalline silicon gate MIS type semiconductor device, region 21 is an N-type diffused layer for defining a PN junction diode together with the P-type substrate 1. The region 21 serves as a source or drain of the MIS type semiconductor device. A polycrystalline silicon gate electrode layer 22 for defining a memory cell region in the substrate 1 is placed on a thin silicon dioxide film 23 and simultaneously formed with the polycrystalline silicon layer 3-1 (FIG. 2). An insulating film 24 of silicon dioxide or PSG is formed on the memory cell electrode 22. It is preferable to form the PSG film 24 and the PSG film 2-2 (FIG. 2), and then to diffuse an impurity of the PSG films 24 and 2-2 simultaneously into the polycrystalline silicon layers 22 and 3-1, respectively.

In a specific embodiment of the present invention, the PSG films 24 and 2-2 are left after the above-mentioned diffusion into the cell electrode 22 and the layer 3-1, respectively. The PSG film 24 is then removed at a surface area of a transfer electrode 25 and the region 21 together with the removal of the silicon layer 22 and the silicon dioxide layer 23 on the surface area of the semiconductor substrate. The substrate 1 exposed at this surface area is thereafter subjected to thermal oxidation to form a gate oxide for the transfer gate 25.

In another specific embodiment of the present invention, the PSG films 24 and 2-2 are etched off and the silicon layer 22 and the silicon dioxide layer 23 are then removed from the surface area of the substrate 1 in the vicinity of the diffused impurity region 21 and the location of the future gate electrode 25. The substrate is now subjected to thermal oxidation to form a gate oxide for the transfer gate 25. During thermal oxidation, the exposed silicon layers 22 and 3-1 are also covered with the silicon oxide which now constitutes the oxide layer 24 on the silicon layer 22 and the oxide on the silicon layer 3-1 as shown in FIGS. 2 and 3.

The transfer gate electrode 25 of polycrystalline silicon partially overlaps the memory cell electrode 22 and defines a gate region on the substrate surface. It is preferable to form the gate electrode 25 and the polycrystalline silicon layer 3-2 (FIG. 2) simultaneously. An insulating film 26 of SiO2 or PSG is formed on the gate electrode 25. It is preferable to form the PSG film 26 and the PSG film 2-3 simultaneously and then to diffuse an impurity of the PSG films 26 and 2-3 into the transfer gate electrode 25 and the polycrystalline silicon layer 3-2. At the same time the N type region 21 is formed by the diffusion of the impurity of the PSG film 26. According to the embodiments explained in connection with FIGS. 2 and 3, the process for producing the semiconductor device is very simple, because no additional steps are necessary for producing the layers or films 3-1, 3-2, 2-2 and 2-3.

A thick silicon dioxide film 27 is formed on the substrate 1 so as to surround the single element of the double silicon gate MIS device. However, it is preferable for the film 27 to be formed simultaneously with the formation of the silicon dioxide film 2-1 (FIG. 2).

The explanation above is related to several embodiments of the present invention and alternative methods may be applicable for manufacturing the semiconductor device. For example, the doping of the silicon layers 3-1 and 3-2 may be carried out by using a well known ion implantation method or a doping method during chemical vapor deposition of the silicon layers, although the doping of the impurity into the silicon layers 3-1 and 3-2 as illustrated above is carried out by using the PSG film as a diffusion source in the aforesaid embodiments.

Moreover, the windows 4-a, 4-b and 5-a, 5-b are formed at both ends of each of the silicon layers 3-1 and 3-2, respectively, for making the reliable contacts in the aforesaid embodiments. It is, however, possible to form one common opening for exposing both layers 3-1 and 3-2 at each side of these layers 3-1 and 3-2.

As will be apparent from FIGS. 2 and 3, since the polycrystalline silicon layers of the cross wire structure are formed in the insulating films above the semiconductor substrate, the active regions of the MIS memory device formed on the substrate surface can be arranged thereon with a high density and a high degree of integration. In addition, the passive regions of the MIS memory device formed on the substrate surface can also be provided with a high density and a high degree of integration.

What we claim is:

1. A circuit on a semiconductor substrate comprising commonly fabricated components in plural electrode crossover structures and respective plural semiconductor devices, each said crossover structure comprising:
    a first insulating film on a respective portion of the surface of said substrate;
    first and second selectively shaped conductive semiconductor layers over said first insulating film, said first and second layers extending in common with substantial overlap at least in a first direction;
    a second insulating film between said first and second layers and a third insulating film selectively covering exposed portions of said first and second conductive semiconductor layers, both said second and third insulating films being selectively formed to leave exposed contact holes at respective end portions of each of said first and second conductive semiconductor layers along said first direction;
    a first metal wiring layer having two separate portions selectively formed on said second and third insulating films, each said portion being in contact with said first and second conductive layers at a respective adjacent pair of said contact holes to connect said two layers in parallel with each other along said first direction; and
    a second metal wiring layer formed on said third insulating film to cross over said first and second conductive layers where said first and second conductive semiconductive layers extend in said first direction; and
    each said semiconductor device comprising at least one insulating film, at least one conductive semiconductor layer and at least one wiring layer corresponding to selected ones of said conductive semiconductor layers, said insulating films and said wiring layers of said electrode crossover structure to comprise said commonly fabricated components.

2. A semiconductor device having at least one crossover structure for two respective wiring lines, said device comprising:
    a semiconductor substrate;
    a first insulating film covering the surface of said semiconductor substrate;

a lower layer and an upper layer of a conductive semiconductor extending selectively over said first insulating film, said layers extending at least in part along a common direction, and said upper layer overlapping to a major extent said lower layer at least along said extension in said common direction;

a second insulating film separating said lower and upper layers of a conductive semiconductor;

a third insulating film selectively covering said upper layer of said conductive semiconductor and any exposed portions of said lower conductive semiconductor layer and said semiconductor substrate in at least a region over said common extension of said conducting semiconductor layers;

two portions of a first metallic wire layer formed selectively on said second and third insulating film, each said portion of said first metallic wire layer being commonly connected to a respective pair of adjoining ends of said lower and upper layers of said conductive semiconductor, thereby connecting said lower and upper layers in parallel between said two portions of said first metallic wire layer along said common direction; and a second metallic wire layer formed on a portion of said third insulating film to cross over said parallel-connected conductive semiconductor layers in said region of common extension of said conductive semiconductor layers, said second metallic wire layer and said lower and upper layers of conducting semiconductor in said region being comprised in said at least one crossover structure.

3. A semiconductor device according to claim 2, said semiconductor substrate comprising silicon and each of said lower and upper layers of said conductive semiconductor comprising impurity-doped polycrystalline silicon.

4. A semiconductor device according to claim 2 or 3, said overlap of said upper and lower conductive semiconductor layers being such that the layers essentially coincide at least in the vicinity where said second wiring layer crosses over.

5. A semiconductor device according to claim 3, 4 or 1, said conductive semiconductor comprising polycrystalline silicon containing an impurity in an amount of at least about $10^{18}$ cm$^{-3}$.

6. A semiconductor integrated circuit device having at least one double conductor-insulator-semiconductor gate element on a first surface area of a semiconductor substrate and a wiring crossover structure on a second surface area of said semiconductor substrate, said device comprising:

a first insulating film covering said second surface area of said semiconductor substrate and surrounding said first surface area of said semiconductor substrate;

a gate insulating film in said first surface area on said semiconductor substrate;

a first semiconductor gate electrode selectively covering said gate insulator film in said first surface area;

a second insulating film selectively covering said first semiconductor electrode;

a second semiconductor gate electrode selectively overlapping said first semiconductor electrode in said first surface area, said first and second semiconductor gate electrodes separated by said second insulating film comprising said double gate element;

a lower layer and an upper layer of a conductive semiconductor extending selectively in common with major overlap at least along a first direction over said first insulating film in said second surface area, said lower layer comprising the same conducting semiconductor layer as that of said first semiconductor gate electrode, and said upper layer comprising the same conducting semiconductor layer as that of said second semiconductor gate electrode, said second insulating film extending in between the overlapping portions of said upper and lower conducting semiconductor layers;

a third insulating film selectively covering said double gate element in said first surface area and exposed portions of said lower and upper layers of said conductive semiconductor in said second surface area;

at least two portions of a first metallic wire on selective portions of said second and third insulating films, each contacting a respective pair of adjacent ends of said lower and upper layers of conductive semiconductor to connect said lower and upper layers in parallel along said common direction; and a second metallic wire formed on a portion of said third insulating film to cross over said upper and lower layers of conductive semiconductor, said first and second metallic wires being formed of the same metal layer.

7. A semiconductor integrated circuit according to claim 6, said substrate comprising silicon, and said first and second semiconductor gate electrodes and said upper and lower conductive semiconductor layers comprising impurity-containing polycrystalline silicon.

8. A semiconductor integrated circuit device according to claim 7, said impurity-containing polycrystalline silicon containing said impurity in an amount of at least approximately $10^{18}$ /cm$^3$.

9. The device of claim 2, 5 or 1, at least said second insulating film comprising a PSG insulating layer.

10. The circuit of claim 1, at least one of said first, second and third insulating films of each said cross electrode structure selectively extending in common in selective correspondence with at least one of said insulating films of said semiconductor devices.

11. The circuit of claim 10, each said device comprising at least one gate element having two separate semiconductor conductor gate electrodes, each said conductive semiconductor gate electrode corresponding to a respective one of said upper and lower conductive semiconductor layers of said electrode crossover structure(s).

12. The circuit of claim 10, said first and second wiring layers also comprising commonly fabricated components between said crossover structures and said devices.

13. The device of claim 2 or 3, comprising a circuit component corresponding to each said crossover structure, said corresponding circuit component having elements comprising selective portions of selected ones of each said insulating film, each said layer of conductive semiconductor and each said metal wiring layer.

* * * * *

UNITED STATES PATENT AND TRADEMARK OFFICE
CERTIFICATE OF CORRECTION

PATENT NO. : 4,278,989
DATED : 14 July 1981
INVENTOR(S) : FUMIO BABA et al.

It is certified that error appears in the above—identified patent and that said Letters Patent is hereby corrected as shown below:

Front page, Abstract [57] line 6, after "material"
     insert --,--.
Col. 1, line 6, "particularlly" should be --particularly--;
       line 29, "cross under" should be --cross-under--;
       line 33, after "points" insert --,--.
Col. 3, line 1, after "electrodes" insert --and--;
       line 21, "layer" should be --layers--;
       line 61, delete "of".
Col. 4, line 2, delete "of";
       line 11, delete "of";
       line 30, after "6-a" insert --and 6-$\underline{b}$--;
       line 59, delete "o$\overline{f}$";
       line 64, "6$\underline{b}$" should be --6-$\underline{b}$--.
Col. 6, line 53, "semiconductive" should be --semiconductor--.
Col. 7, line 43, delete ", 4".
Col. 8, line 42, "5" should be --6--.

Signed and Sealed this

First Day of December 1981

[SEAL]

Attest:

GERALD J. MOSSINGHOFF

Attesting Officer     Commissioner of Patents and Trademarks